United States Patent
Lugani et al.

(10) Patent No.: US 9,799,658 B2
(45) Date of Patent: *Oct. 24, 2017

(54) METHODS OF FORMING CAPACITORS

(71) Applicant: Micron Technology, Inc., Boise, ID (US)

(72) Inventors: Gurpreet Lugani, Boise, ID (US); Kevin J. Torek, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 59 days.

This patent is subject to a terminal disclaimer.

(21) Appl. No.: 14/931,073

(22) Filed: Nov. 3, 2015

(65) Prior Publication Data

US 2016/0055973 A1 Feb. 25, 2016

Related U.S. Application Data

(60) Continuation of application No. 14/147,895, filed on Jan. 6, 2014, now Pat. No. 9,196,673, which is a
(Continued)

(51) Int. Cl.
*H01L 27/108* (2006.01)
*H01L 49/02* (2006.01)
(Continued)

(52) U.S. Cl.
CPC ....... *H01L 27/10852* (2013.01); *H01G 4/005* (2013.01); *H01G 4/008* (2013.01); *H01G 4/06* (2013.01); *H01L 21/3065* (2013.01); *H01L 21/32137* (2013.01); *H01L 27/10894* (2013.01); *H01L 28/40* (2013.01); *H01L 28/60* (2013.01); *H01L 28/75* (2013.01); *H01L 21/31116* (2013.01); *H01L 28/91* (2013.01)

(58) Field of Classification Search
None
See application file for complete search history.

(56) References Cited

U.S. PATENT DOCUMENTS 5,591,664 A * 1/1997 Wang ................ H01L 27/10852
257/E21.648
5,731,225 A * 3/1998 Yamamori ........ H01L 21/76838
257/E21.538

(Continued)

OTHER PUBLICATIONS

Eisele, "SF6, a preferable etchant for plasma etching silicon", J. Electrochem. Soc. v. 128, 1981, pp. 123-126.*
(Continued)

*Primary Examiner* — Mary Wilczewski
*Assistant Examiner* — Erik T Peterson
(74) *Attorney, Agent, or Firm* — Wells St. John, P.S.

(57) ABSTRACT

A method of forming capacitors includes providing first capacitor electrodes within support material. The first capacitor electrodes contain TiN and the support material contains polysilicon. The polysilicon-containing support material is dry isotropically etched selectively relative to the TiN-containing first capacitor electrodes using a sulfur and fluorine-containing etching chemistry. A capacitor dielectric is formed over sidewalls of the first capacitor electrodes and a second capacitor electrode is formed over the capacitor dielectric. Additional methods are disclosed.

26 Claims, 4 Drawing Sheets

Related U.S. Application Data division of application No. 13/559,073, filed on Jul. 26, 2012, now Pat. No. 8,652,926.

(51) Int. Cl.

| | |
|---|---|
| *H01L 21/3065* | (2006.01) |
| *H01L 21/3213* | (2006.01) |
| *H01G 4/008* | (2006.01) |
| *H01G 4/005* | (2006.01) |
| *H01G 4/06* | (2006.01) |
| *H01L 21/311* | (2006.01) |

(56) References Cited

U.S. PATENT DOCUMENTS

| | | |
|---|---|---|
| 6,709,918 B1 | 3/2004 | Ng et al. |
| 6,767,821 B1 * | 7/2004 | Yang ................ H01L 21/32137 257/E21.312 |
| 7,267,127 B2 * | 9/2007 | Watanabe ........... H01L 21/0206 134/1.2 |
| 2006/0051918 A1 * | 3/2006 | Busch .................... H01L 28/91 438/253 |
| 2011/0095435 A1 | 4/2011 | Volant et al. |
| 2011/0298085 A1 | 12/2011 | Terletzki |
| 2012/0040507 A1 * | 2/2012 | Lee .................... H01L 27/0207 438/381 |
| 2013/0164902 A1 * | 6/2013 | Greeley ................ H01L 28/90 438/381 |

OTHER PUBLICATIONS

Jansen, et al. "A survey on the reactive ion etching of silicon in microtechnology", J. Micromech. Microeng. v. 6, 1996, pp. 14-28.*

* cited by examiner

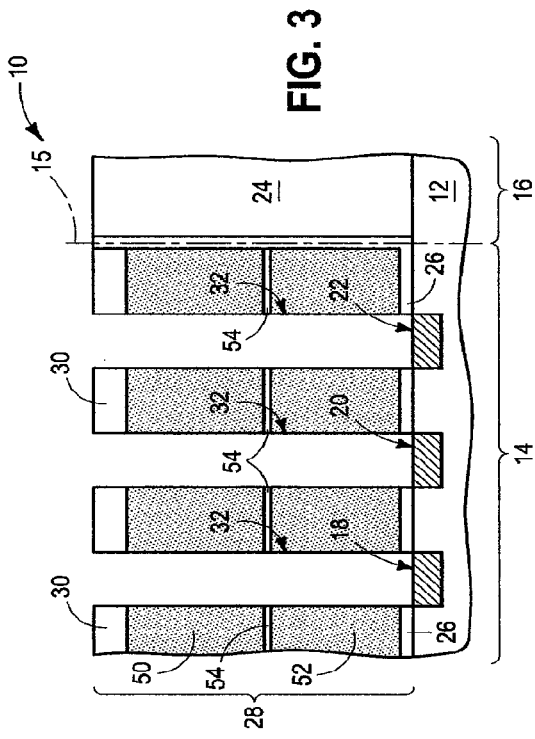
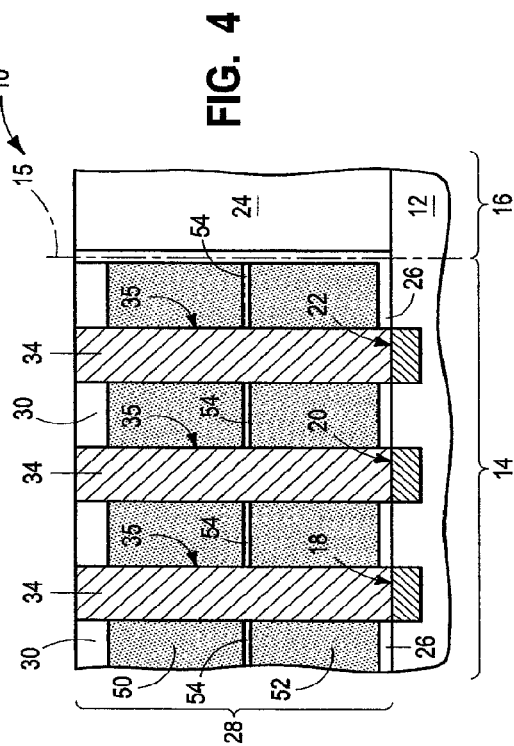
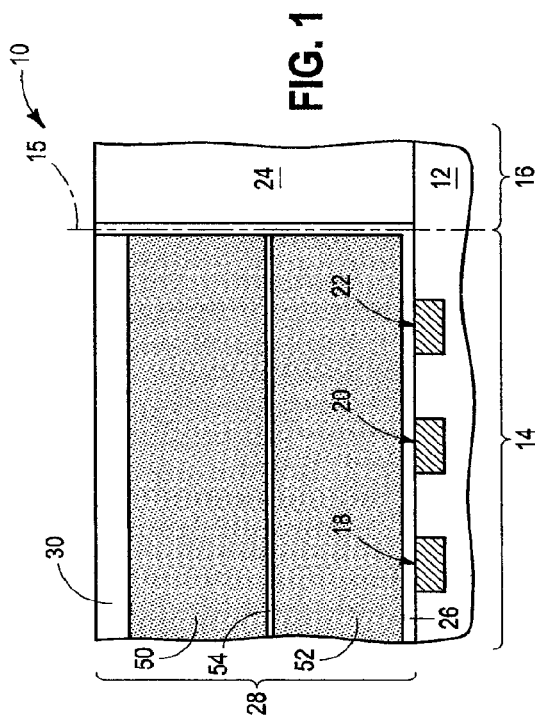
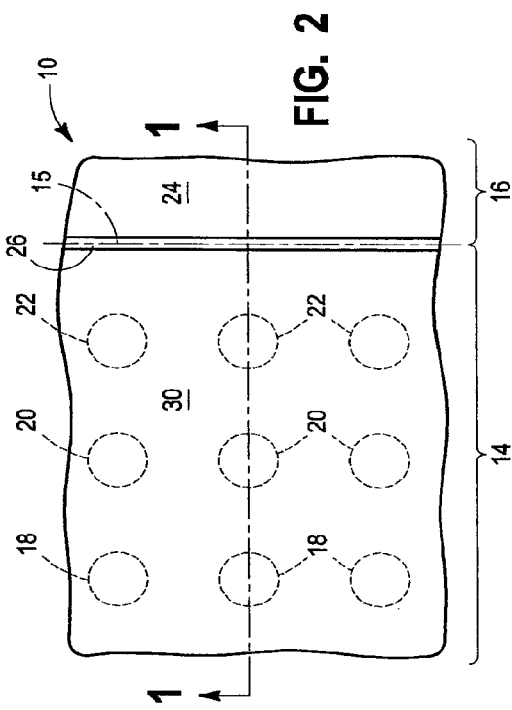

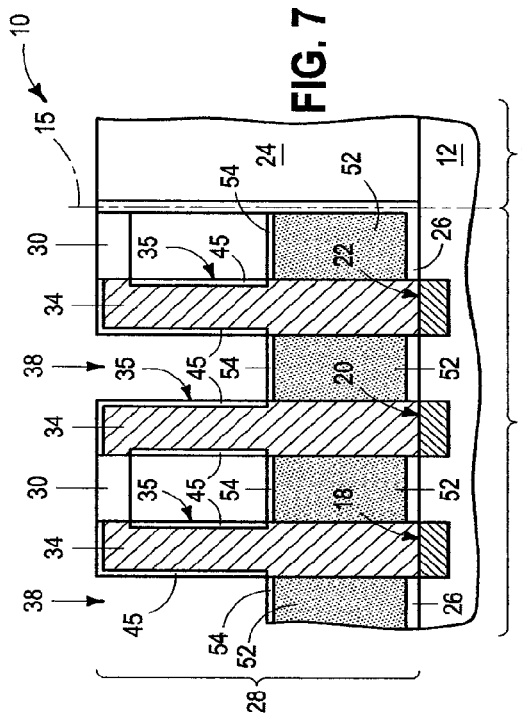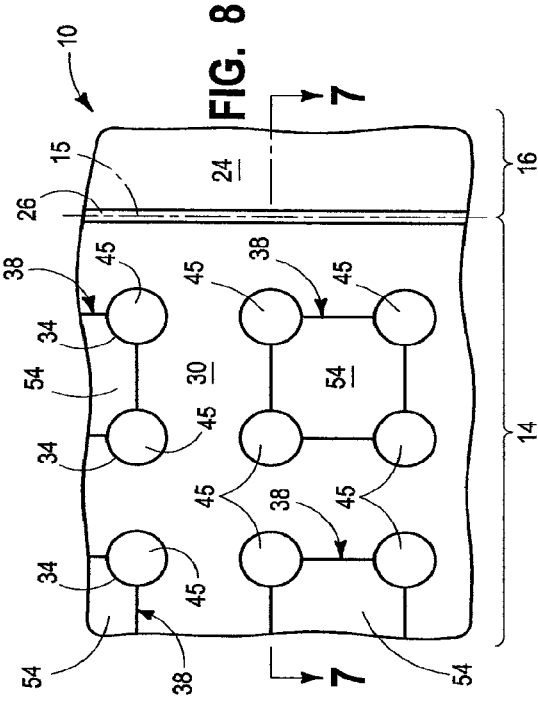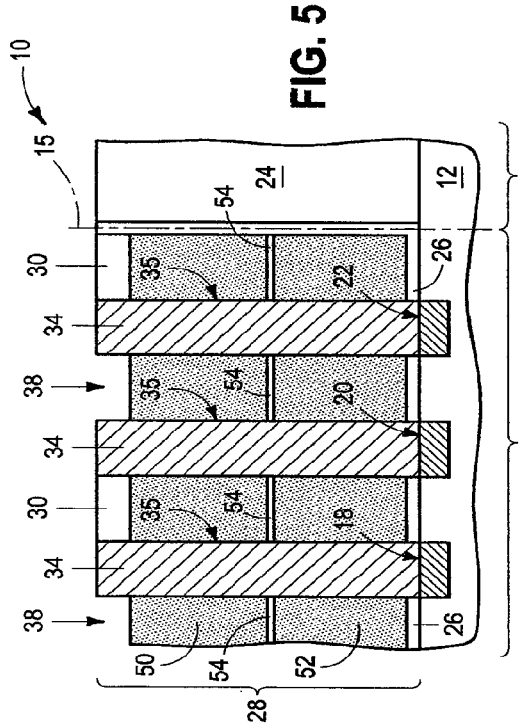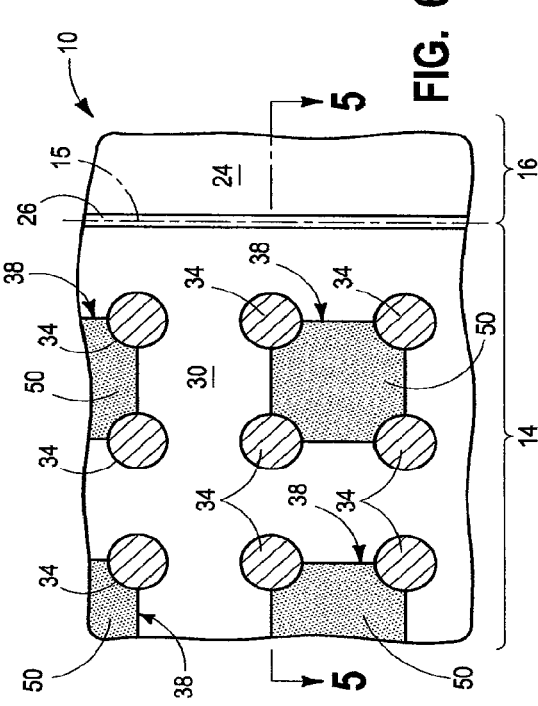

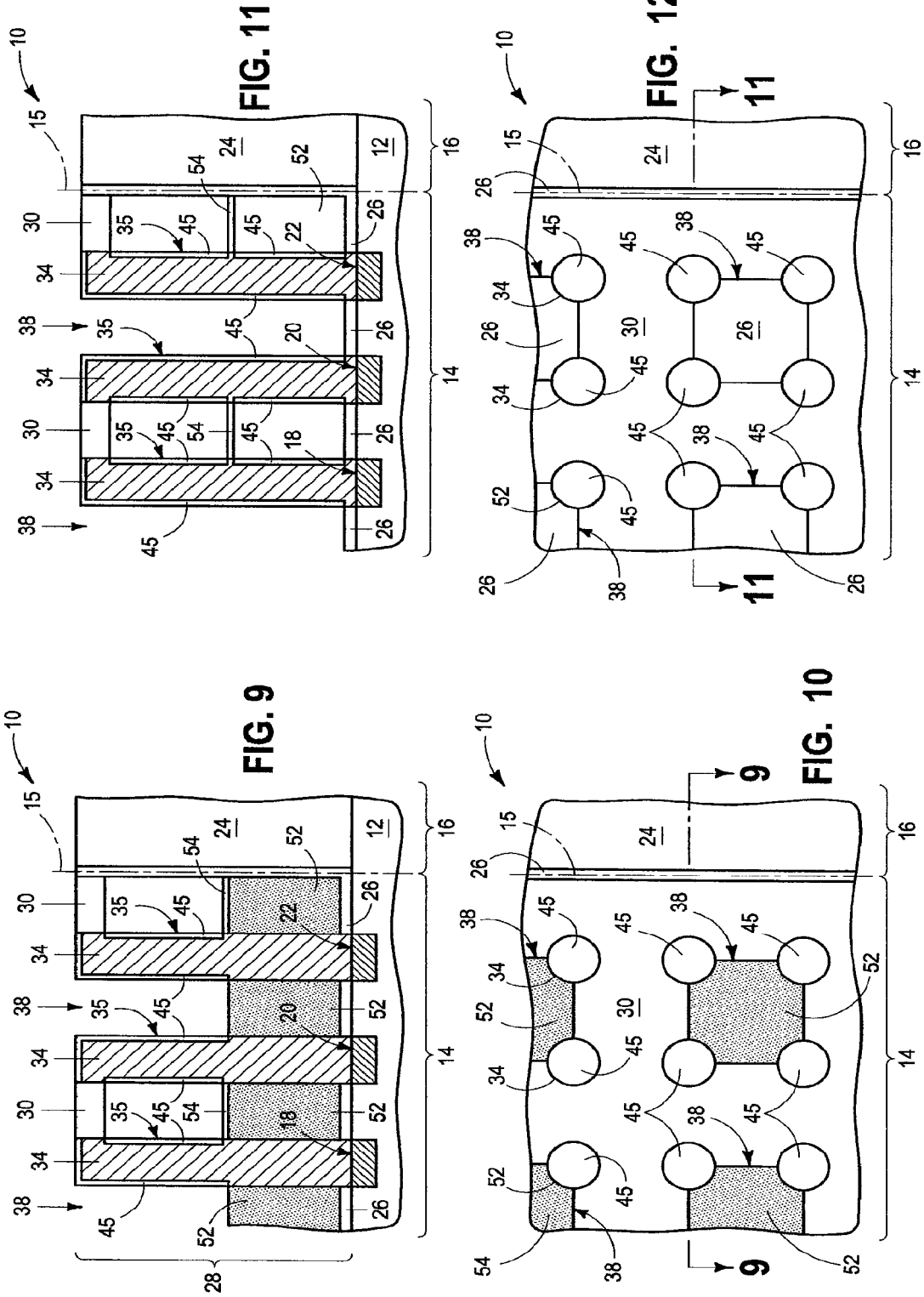

METHODS OF FORMING CAPACITORS

RELATED PATENT DATA

This patent resulted from a continuation application of U.S. patent application Ser. No. 14/147,895, filed Jan. 6, 2014, entitled "Methods Of Forming Capacitors", naming Gurpreet Lugani and Kevin J. Torek as inventors, which is a divisional application of U.S. patent application Ser. No. 13/559,073, filed Jul. 26, 2012, now U.S. Pat. No. 8,562,926, entitled "Methods Of Forming Capacitors", naming Gurpreet Lugani and Kevin J. Torek as inventors, the disclosures of which are incorporated by reference.

TECHNICAL FIELD

Embodiments disclosed herein pertain to methods of forming capacitors.

BACKGROUND

Capacitors are one type of component used in the fabrication of integrated circuits, for example in DRAM and other memory circuitry. A capacitor is comprised of two conductive electrodes separated by a non-conducting dielectric region. As integrated circuitry density has increased, there is a continuing challenge to maintain sufficiently high storage capacitance despite decreasing capacitor area. The increase in density has typically resulted in greater reduction in the horizontal dimension of capacitors as compared to the vertical dimension. In many instances, the vertical dimension of capacitors has increased.

One manner of fabricating capacitors is to initially form an insulative material within which a capacitor storage electrode is formed. For example, an array of capacitor electrode openings for individual capacitors may be fabricated in an insulative support material, with an example material being silicon dioxide doped with one or both of phosphorus and boron. Openings within which some or all of the capacitors are formed are etched into the support material. It can be difficult to etch such openings through the support material, particularly where the openings are deep.

Further and regardless, it is often desirable to etch away most if not all of the capacitor electrode support material after individual capacitor electrodes have been formed within the openings. This enables outer sidewall surfaces of the electrodes to provide increased area and thereby increased capacitance for the capacitors being formed. However, capacitor electrodes formed in deep openings are often correspondingly much taller than they are wide. This can lead to toppling of the capacitor electrodes during etching to expose the outer sidewalls surfaces, during transport of the substrate, during deposition of the capacitor dielectric layer, and/or outer capacitor electrode layer. U.S. Pat. No. 6,667,502 teaches the provision of a brace or retaining structure intended to alleviate such toppling. Other aspects associated in the formation of a plurality of capacitors, some of which include bracing structures, have also been disclosed, such as in:

U.S. Pat. No. 7,067,385;
U.S. Pat. No. 7,125,781;
U.S. Pat. No. 7,199,005;
U.S. Pat. No. 7,202,127;
U.S. Pat. No. 7,387,939;
U.S. Pat. No. 7,439,152;
U.S. Pat. No. 7,517,753;
U.S. Pat. No. 7,544,563;
U.S. Pat. No. 7,557,013;
U.S. Pat. No. 7,557,015;
U.S. Patent Publication No. 2008/0090416;
U.S. Patent Publication No. 2008/0206950;
U.S. Pat. No. 7,320,911;
U.S. Pat. No. 7,682,924; and
U.S. Patent Publication No. 2010/0009512.

Fabrication of capacitors in memory circuitry may include forming an array of capacitors within a capacitor array area. Control or other circuitry area is often displaced from the capacitor array area, and the substrate may include an intervening area between the capacitor array area and the control or other circuitry area.

BRIEF DESCRIPTION OF THE DRAW+INGS

FIG. 1 is a diagrammatic, cross-sectional view of a portion of a semiconductor substrate at a preliminary processing stage of an embodiment in accordance with the invention.

FIG. 2 is a diagrammatic top view of a portion of the semiconductor substrate comprising the cross-section shown in FIG. 1 along the line 1-1.

FIG. 3 is a view of the FIG. 1 substrate at a processing stage subsequent to that of FIG. 1.

FIG. 4 is a view of the FIG. 3 substrate at a processing stage subsequent to that of FIG. 3.

FIG. 5 is a view of the FIG. 4 substrate at a processing stage subsequent to that of FIG. 4.

FIG. 6 is a diagrammatic top view of a portion of the semiconductor substrate comprising the cross-section shown in FIG. 5 along the line 5-5.

FIG. 7 is a view of the FIG. 5 substrate at a processing stage subsequent to that of FIG. 5.

FIG. 8 is a diagrammatic top view of a portion of the semiconductor substrate comprising the cross-section shown in FIG. 7 along the line 7-7.

FIG. 9 is a view of the FIG. 7 substrate at a processing stage subsequent to that of FIG. 7.

FIG. 10 is a diagrammatic top view of a portion of the semiconductor substrate comprising the cross-section shown in FIG. 9 along the line 9-9.

FIG. 11 is a view of the FIG. 9 substrate at a processing stage subsequent to that of FIG. 9.

FIG. 12 is a diagrammatic top view of a portion of the semiconductor substrate comprising the cross-section shown in FIG. 11 along the line 11-11.

DETAILED DESCRIPTION OF EXAMPLE EMBODIMENTS

Figure 13:
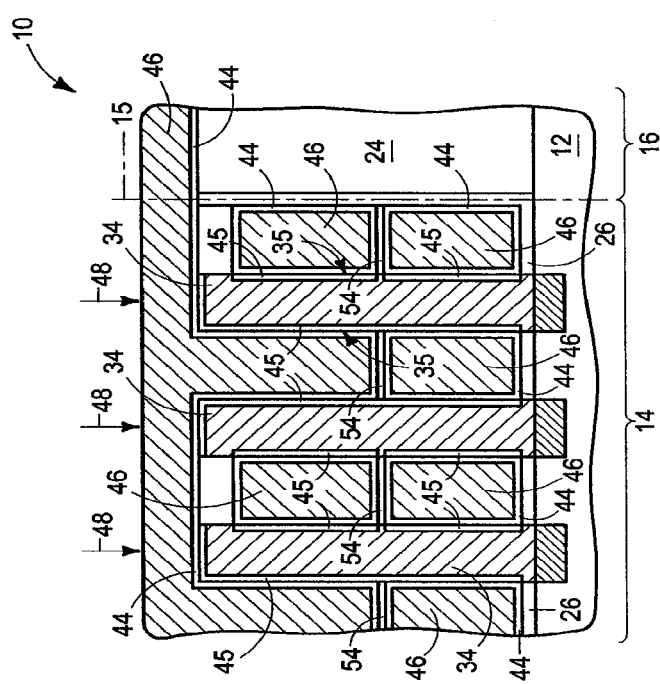
FIG. 13 is a view of the FIG. 11 substrate at a processing stage subsequent to that of FIG. 11.

Example methods of forming capacitors in accordance with embodiments of the invention are described with reference to FIGS. 1-13. Referring initially to FIGS. 1 and 2, a construction 10 is shown at a preliminary processing stage of an embodiment. Construction 10 includes a substrate 12 which may comprise semiconductive material. To aid in interpretation of the claims that follow, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Construction 10 may comprise a capacitor array area 14 and a peripheral circuitry area 16. An interface line 15 has been used in the figures as an example interface of capacitor array area 14 and peripheral circuitry area 16. Logic circuitry may be fabricated within peripheral circuitry area 16. Control and/or other peripheral circuitry for operating a memory array may or may not be fully or partially within array area 14, with an example memory array area 14 as a minimum encompassing all of the memory cells of a given memory array/sub-memory array. Further, multiple sub-arrays may also be fabricated and operated independently, in tandem, or otherwise relative one another. As used herein, a "sub-array" or "sub-memory array" may be considered as an array. Various circuit devices (not shown) may be associated with peripheral circuitry area 16, as well as with capacitor array area 14, at the processing stage of FIGS. 1 and 2.

Electrically conductive node locations 18, 20, and 22 are shown within memory array area 14. Node locations 18, 20, and 22 may correspond to, for example, conductively-doped diffusion regions within a semiconductive material of substrate 12, and/or to conductive pedestals associated with substrate 12. Although the node locations are shown to be electrically conductive at the processing stage of FIG. 1, the electrically conductive materials of the node locations could be provided at a processing stage subsequent to that of FIG. 1. The node locations may ultimately be electrically connected with transistor or other constructions (not shown), may correspond to source/drain regions of transistor constructions, or may be ohmically connected to source/drain regions of transistor constructions. As alternate examples, the node locations may correspond to, connect to, or be parts of conductive interconnect lines. Regardless, as used herein, "node locations" refers to the elevationally outermost surfaces to which first capacitor electrodes electrically connect, for example as described below.

Dielectric material 24 may be over peripheral circuitry area 16. Such may be homogenous or non-homogenous, with doped silicon dioxide such as phosphosilicate glass (PSG) and borophosphosilicate glass (BPSG) being examples. Dielectric material 24 may be formed by blanket deposition over substrate 12, and then removed by subtractive patterning from array circuitry area 14. An example thickness range for dielectric material 24 is about 0.5 micron to about 3 microns.

A support material 28 has been formed elevationally over substrate 12 within capacitor array area 14. In one embodiment, support material 28 may be directly against node locations 18, 20, and 22. In this document, a material or structure is "directly against" another when there is at least some physical touching contact of the stated materials or structures relative one another. In contrast, "over", "on", and "against" not proceeded by "directly", encompass "directly against" as well as constructions where intervening material(s) or structure(s) result(s) in no physical touching contact of the stated materials or structures relative one another. Support material 28 may be homogenous or non-homogenous, and may be any one or more of dielectric, conductive, or semiconductive. For example, support material 28 may be a single homogenous layer of a dielectric, conductive or semiconductive material; multiple layers of a single homogenous dielectric, conductive, or semiconductive material; or multiple layers of differing compositions of dielectric, conductive, and or semiconductive materials. An example thickness for support material 28 is about 0.25 micron to about 3 microns.

FIGS. 1 and 2 show support material 28 as comprising covering material 30, an elevationally outer material 50, an elevationally inner material 52, an elevationally intermediate material 54 between materials 50 and 52, and dielectric material 26. Each may be homogenous or non-homogenous. Covering material 30 and intermediate material 54 are of different composition from composition of outer material 50 and inner material 52. Covering material 30 and intermediate material 54 may be of the same or different composition relative each other, and regardless are ideally dielectric when remaining as part of the finished circuitry construction. Example materials include one or both of silicon nitride and silicon dioxide. An example thickness for covering material 30 is about 600 Angstroms to about 1,500 Angstroms, with that for intermediate material 54 being about 50 Angstroms to about 600 Angstroms. Elevationally outer material 50 and elevationally inner material 52 may be of the same or different composition relative each other. Example materials include one or more of doped or undoped silicon, carbon, polyimide, and oxide, with an ideal example being polysilicon. An example thickness for outer material 50 is about 500 Angstroms to about 1,000 Angstroms, with that for inner material 54 being about 1,000 Angstroms to about 8,000 Angstroms. Examples for dielectric material 26 are one or both of silicon nitride and undoped silicon dioxide. An example thickness range for dielectric material 26 is about 50 Angstroms to about 300 Angstroms. Regardless, multiple intermediate materials 54 (e.g., that are elevationally spaced from one another) may be used (not shown).

Referring to FIG. 3, individual capacitor openings 32 have been formed through covering material 30, outer material 50, intermediate material 54, elevationally inner material 52, and dielectric material 26 to node locations 18, 20, and 22. An example technique for forming openings 32 includes photolithographic patterning and anisotropic etch. Multiple etching chemistries may be used for etching material(s) 28 as selected by the artisan. An example for anisotropically etching silicon nitride includes plasma etching using an inductively coupled plasma reactor with about 700 W to 900 W top power, about 250V to 450V chuck bias, chamber pressure about 6 mTorr to 20 mTorr, substrate temperature about 25° C. to 45° C., $CH_2F_2$ flow about 15 sccm to 35 sccm, and $CF_4$ flow about 75 sccm to 125 sccm. An example for anisotropically etching doped or undoped polysilicon includes $NF_3$:$O_2$:HBr at a volumetric ratio of 1:1:3 to5. Alternate examples for anisotropically etching polysilicon include substituting $SF_6$ or $Cl_2$ for the $NF_3$, and in such events providing an alternate volumetric ratio of 1:1:1.

Referring to FIG. 4, a first capacitor electrode 34 has been formed within individual openings 32 in support material 28 in conductive electrical connection with respective node locations 18, 20, and 22. First capacitor electrodes 34 may be homogenous or non-homogenous, and may be of any suitable shape(s) with a solid pillar-like shape being shown. As an alternate example, the first capacitor electrodes may be in the shape of upwardly open containers. First capacitor electrodes 34 may be formed by depositing one or more conductive materials to overfill openings 32, followed by planarizing the conductive material back at least to the outermost surface of covering material 30. Example conductive materials are one or combinations of titanium, titanium nitride, and ruthenium. First capacitor electrodes may be considered as comprising sidewalls 35.

Referring to FIGS. 5 and 6, openings 38 have been formed through covering material 30, for example by anisotropic etching, to expose support material 28. In one embodiment, a mask (not shown) over covering material 30 and first capacitor electrodes 34 may be used as an etch mask during such anisotropic etching, with such a mask having openings the shape of openings 38. That mask may be everywhere spaced elevationally from covering material 30 and capacitor electrodes 34, or may comprise one or more materials (i.e., photosensitive, hard-mask, and/or antireflective materials) deposited over covering material 30 and capacitor electrodes 34. Regardless, an example mask thickness is about 1,000 Angstroms to about 10,000 Angstroms.

Referring to FIGS. 7 and 8, outer material 50 (not shown) has been dry isotropically etched from being over capacitor electrode 34, and in one embodiment as shown from being over intermediate material 54. The etching of outer material 50 is conducted selectively relative to capacitor electrode 34, and in one embodiment selectively relative to intermediate material 54, in one embodiment selectively relative to covering material 30. In the context of this document, a selective etch requires removal of one material relative to a stated another material at a removal rate of at least 2:1. In one embodiment, the dry isotropic etching of material 50 uses plasma. In one embodiment, no wet etching is used in removing any of outer material 50. In one embodiment and as shown, all of outer material 50 is removed. In one embodiment, a mask used in forming openings 38 through covering material 30 remains over the substrate during etching of outer material 50 (not shown).

In one embodiment where outer material 50 comprises polysilicon and capacitor electrodes 34 comprise TiN, the dry isotropic etching of outer material 50 comprises plasma etching using a sulphur and fluorine-comprising chemistry. The sulfur and fluorine-comprising chemistry may be derived from a single compound (e.g., $SF_6$) and/or from multiple compounds (e.g. COS, $SO_2$, $H_2S$, $NF_3$, and $F_2$). In one embodiment, the etching is conducted at a pressure of at least about 150 mTorr and in one embodiment at a pressure of at least about 200 mTorr. In one embodiment, the etching is conducted at a substrate temperature of no greater than about 30° C., in one embodiment at no greater than 10° C., and in one embodiment at no greater than 0° C. Ideal results may be achieved at higher pressure and lower temperature (i.e., at least 200 mTorr and no greater than 10° C.). In one embodiment, the etching chemistry is derived from gas comprising $SF_6$, and with or without one or more inert gases.

An example first set of etching conditions in an inductively coupled plasma reactor for etching polysilicon-comprising support material selectively relative to TiN-comprising first capacitor electrodes includes about 700 W to 900 W top power, 0V to about 20V chuck bias, chamber pressure about 150 mTorr to 250 mTorr, substrate temperature about −10° C. to 40° C., $SF_6$ flow about 200 sccm to 400 sccm, $NF_3$ flow about 40 sccm to 60 sccm, and He and/or Ar flow 0 sccm to about 350 sccm. An example second set of etching conditions for etching polysilicon-comprising support material selectively relative to TiN-comprising first capacitor electrodes includes about 1,000 W to 2,000 W top power, 0V to about 20V chuck bias, chamber pressure about 150 mTorr to 250 mTorr, substrate temperature about −10° C. to 30° C., $SF_6$ flow about 50 sccm to 900 sccm, and He and/or Ar flow about 300 sccm to 1500 sccm. Use of $SF_6$ solely as the contributor to reactive species formation may provide better etch selectivity relative to TiN and $Si_3N_4$ in comparison to combining $SF_6$ and $NF_3$, but more etch residue.

In one embodiment, the etching of polysilicon-comprising support material selectively relative to TiN-comprising first capacitor electrodes includes a plurality of sulphur and fluorine-comprising etching steps individually separated by a hydrogen treating step. In one embodiment, the hydrogen treating steps are conducted at lower pressure than are the sulphur and fluorine-comprising etching steps. In one embodiment, the hydrogen treating steps are individually longer than are individual of the sulphur and fluorine-comprising etching steps. In one embodiment, the hydrogen treating and the etching steps are each conducted using plasma. In one embodiment, a hydrogen-containing plasma is used in the hydrogen treating step and is derived from gas consisting essentially of $H_2$. An example set of hydrogen treating conditions in an inductively coupled plasma reactor includes about 800 W to 5,000 W top power, 0V to about 20V chuck bias, chamber pressure about 40 mTorr to 250 mTorr, substrate temperature about −10° C. to 30° C., $H_2$ flow about 200 sccm to 1,200 sccm, and He and/or Ar flow 0 sccm to about 1500 sccm. An example time period for individual etching steps is about 2 seconds to 6 seconds, and that for individual hydrogen treating steps about 8 seconds to 10 seconds. Hydrogen treating may be conducted to remove residue, if any, that might result from the act of etching with a sulphur and fluorine-comprising etching chemistry.

In one embodiment and as shown, TiF 45 is formed on first capacitor electrode sidewalls 35 from Ti of the TiN of first capacitor electrodes 34 and from fluorine of the sulfur and fluorine-comprising etching chemistry. In one embodiment, TiF is formed to a thickness that is self-limited in spite of further exposure of capacitor electrodes 34 to the sulphur and fluorine-comprising etching chemistry. Such an example self-limited thickness is about 10 Angstroms. Regardless, TiF is electrically conductive but not as much as TiN.

In one embodiment of a method of forming capacitors, polysilicon-comprising support material is dry isotropically etched selectively relative to TiN-comprising first capacitor electrodes using a sulphur and fluorine-comprising etching chemistry regardless of presence of covering material 30, intermediate material 54, and/or dielectric material 26. Any other attribute as described above may be used. In one embodiment of a method of forming capacitors, polysilicon-comprising support material is dry isotropically etched using a fluorine-comprising etching chemistry that combines Ti of the TiN of the capacitor electrodes with fluorine of the etching chemistry to form TiF on sidewalls of the first capacitor electrodes. In one embodiment, the etching chemistry comprises S. In one embodiment, the etching is conducted selectively relative to the TiN-comprising first capacitor electrodes. Any other attribute as described above may be used.

Referring to FIGS. 9 and 10, openings 38 have been anisotropically etched through intermediate material 54 to expose inner material 52 using covering material 30 having openings 38 therein as an etch mask. The etching of openings 38 through intermediate material 54 is conducted selectively relative to first capacitor electrodes 34, and in one embodiment selectively relative to covering material 30. In one embodiment, such etching is conducted using plasma. Where, for example, intermediate material 54 comprises silicon nitride, the same example etching conditions described above for etching openings 38 through covering material 30 may be used. In one embodiment, a mask used in forming openings 38 through covering material 30 remains over the substrate during anisotropic etching of intermediate material 54. Such may enable ions in a plasma etching to achieve better directionality. For example, areas bombarded by etching ions may achieve better removal rate than shadowed/off-axis areas in comparison to plasma etching conducted where the mask does not remain over the substrate during the etching.

Referring to FIGS. 11 and 12, inner material 52 (not shown) has been etched through openings 38 in intermediate material 54. The etching of inner material 52 has been conducted selectively relative to first capacitor electrodes 34, in one embodiment selective relative to covering material 30, in one embodiment selective relative to intermediate material 54, and in one embodiment selectively relative to dielectric material 26. In one embodiment, such etching has been conducted isotropically, and in one embodiment comprises dry plasma etching. In one embodiment, most if not all of inner material 52 is removed, with all of such shown as having been removed in FIGS. 11 and 12. Where dry isotropic etching conditions are used, such conditions/chemistry may be the same or different from that used in the dry isotropic etching of outer material 50. In one embodiment during the etching of inner material 52, TiF 45 may be formed on first capacitor electrode sidewalls 35 from Ti of the TiN and from fluorine of the sulphur and fluorine-comprising etching chemistry.

Referring to FIG. 13, a capacitor dielectric 44 is provided over sidewalls 35 of first capacitor electrodes 34. Such may be homogenous or non-homogenous. A second capacitor electrode 46 is formed over capacitor dielectric 44, thereby forming individual capacitors 48. Second capacitor electrode 46 may be homogenous or non-homogenous, and may be of the same composition or of different composition from that of first capacitor electrodes 34. Second capacitor electrode 46 is shown as being a single capacitor electrode common to the individual capacitors, although separate or other multiple second capacitor electrodes may be used. Likewise, capacitor dielectric 44 may be continuously or discontinuously received over multiple first capacitor electrodes 34.

Appropriate circuitry (not shown) would be associated with capacitor electrodes 46 and 34 of capacitors 48 to enable selective operation of individual capacitors 48. This other circuitry is not material to embodiments of this invention, and may be existing or later-developed circuitry within the skill of the artisan.

CONCLUSION

In some embodiments, a method of forming capacitors comprises providing first capacitor electrodes within support material. The first capacitor electrodes comprise TiN and the support material comprises polysilicon. The polysilicon-comprising support material is dry isotropically etched selectively relative to the TiN-comprising first capacitor electrodes using a sulfur and fluorine-containing etching chemistry. A capacitor dielectric is formed over sidewalls of the first capacitor electrodes and a second capacitor electrode is formed over the capacitor dielectric.

In some embodiments, a method of forming capacitors comprises providing first capacitor electrodes within support material. The first capacitor electrodes comprise TiN and the support material comprises polysilicon. The polysilicon-comprising support material is dry isotropically etched using a fluorine-comprising etching chemistry that combines with Ti of the TiN to form TiF on sidewalls of the first capacitor electrodes. A capacitor dielectric is formed over the TiF of the first capacitor electrodes and a second capacitor electrode is formed over the capacitor dielectric.

In some embodiments, a method of forming capacitors comprises providing first capacitor electrodes within support material. The support material comprises an elevationally outer material, an elevationally inner material, an elevationally intermediate material between the outer and inner materials, and a covering material over the outer material. The covering material and the intermediate material are of different composition from composition of the outer and inner materials. Openings are formed through the covering material to expose the outer material. The outer material is dry isotropically etched from being over the first capacitor electrodes and the intermediate material. The etching of the outer material is conducted selectively relative to the first capacitor electrodes and the intermediate material. Openings are anisotropically etched through the intermediate material to expose the inner material using the covering material with openings therein as an etch mask. The etching of openings through the intermediate material is conducted selectively relative to the first capacitor electrodes. The inner material is etched through the openings in the intermediate material. The etching of the inner material is conducted selectively relative to the first capacitor electrodes. A capacitor dielectric is formed over sidewalls of the first capacitor electrodes and a second capacitor electrode is formed over the capacitor dielectric.

In some embodiments, a method of forming capacitors comprises providing first capacitor electrodes comprising TiN within support material. The support material comprises an elevationally outer material comprising polysilicon, an elevationally inner material comprising poly silicon, an elevationally intermediate material between the outer and inner materials, and a covering material over the outer material. The covering material and the intermediate material are of different composition from composition of the outer and inner materials. Openings are anisotropically etched through the covering material to expose the outer material. The polysilicon-comprising outer material is dry isotropically plasma etched from being over the first capacitor electrodes and the intermediate material. The etching of the outer material is conducted selectively relative to the covering material, the first capacitor electrodes, and the intermediate material. The etching of the polysilicon-comprising outer material is conducted with a sulfur and fluorine-comprising etching chemistry, at a pressure of at least about 150 mTorr, and at a substrate temperature of no greater than about 10° C. The etching of the polysilicon-comprising outer material includes a plurality of sulfur and fluorine-comprising plasma etching steps individually separated by a hydrogen-plasma treating step. Openings are anisotropically plasma etched through the intermediate material to expose the inner material using the covering material with openings therein as an etch mask. The etching of openings through the intermediate material is conducted selectively relative to the first capacitor electrodes and the covering material. The polysilicon-comprising inner material is dry isotropically plasma etched through the openings in the intermediate material. The etching of the polysilicon-comprising inner material is conducted selectively relative to the covering material, the first capacitor electrodes, and the intermediate material, and removes at least most of the inner material. The etching of the polysilicon-comprising inner material is conducted with a sulfur and fluorine-comprising etching chemistry, at a pressure of at least about 150 mTorr, and at a substrate temperature of no greater than about 10° C. The etching of the polysilicon-comprising inner material includes a plurality of sulfur and fluorine-comprising plasma etching steps individually separated by a hydrogen-plasma treating step. A capacitor dielectric is formed over sidewalls of the first capacitor electrodes and a second capacitor electrode is formed over the capacitor dielectric.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming capacitors, comprising:
   providing first capacitor electrodes within support material, the first capacitor electrodes comprising TiN, the support material comprising polysilicon;
   dry isotropically etching the polysilicon-comprising support material selectively relative to the TiN-comprising first capacitor electrodes using a sulfur and fluorine-comprising etching chemistry, the etching including a plurality of sulfur and fluorine-comprising etching steps individually separated by a hydrogen treating step, the etching comprising plasma etching, with the sulfur and fluorine-comprising etching chemistry comprises at least one of $SF_6$, COS, $SO_2$, $H_2S$, and $NF_3$, and $F_2$; and
   forming a capacitor dielectric over sidewalls of the first capacitor electrodes and forming a second capacitor electrode over the capacitor dielectric.

2. The method of claim 1 comprising forming TiF on the first capacitor electrode sidewalls from Ti of the TiN and from fluorine of the sulfur and fluorine-comprising etching chemistry.

3. The method of claim 1 being void of any wet etching of the polysilicon-comprising support material.

4. The method of claim 1 wherein the sulfur and fluorine-comprising etching chemistry comprises COS.

5. The method of claim 1 wherein the sulfur and fluorine-comprising etching chemistry comprises $SO_2$.

6. The method of claim 1 wherein the sulfur and fluorine-comprising etching chemistry comprises $H_2S$.

7. The method of claim 1 wherein the sulfur and fluorine-comprising etching chemistry comprises $NF_3$.

8. The method of claim 1 wherein the sulfur and fluorine-comprising etching chemistry comprises $F_2$.

9. A method of forming capacitors, comprising:
   providing first capacitor electrodes within support material; the support material comprising an elevationally outer material, an elevationally inner material, an elevationally intermediate material between the outer and inner materials, and a covering material over the outer material; the covering material and the intermediate material being of different composition from composition of the outer and inner materials;
   forming openings through the covering material to expose the outer material;
   dry isotropically etching the outer material from being over the first capacitor electrodes and the intermediate material;
   anisotropically etching openings through the intermediate material to expose the inner material using the covering material with openings therein as an etch mask;
   etching the inner material through the openings in the intermediate material, the etching of the inner material being conducted selectively relative to the first capacitor electrodes; and
   forming a capacitor dielectric over sidewalls of the first capacitor electrodes and forming a second capacitor electrode over the capacitor dielectric.

10. The method of claim 9 comprising conducting the etching of the outer material selectively relative to the covering material.

11. The method of claim 9 comprising conducting the etching of the intermediate material selectively relative to the covering material.

12. The method of claim 9 comprising conducting the etching of the inner material selectively relative to the covering material.

13. The method of claim 9 comprising conducting the etching of the inner material selectively relative to the intermediate material.

14. The method of claim 9 comprising conducting the etching of the inner material selectively relative to the covering material and the intermediate material.

15. The method of claim 9 wherein the etching of the inner material is dry and isotropic.

16. The method of claim 15 wherein the isotropic etching of the inner material removes at least most of the inner material.

17. The method of claim 15 wherein the outer material comprises polysilicon, the capacitor electrodes comprise TiN, and the etching of the outer material comprises plasma etching using a sulfur and fluorine-comprising chemistry.

18. The method of claim 17 wherein the etching removes all of the polysilicon-comprising outer material.

19. A method of forming capacitors, comprising
   providing first capacitor electrodes within support material, the first capacitor electrodes comprising TiN, the support material comprising polysilicon;
   dry isotropically etching the polysilicon-comprising support material using a fluorine-comprising etching chemistry that combines Ti of the TiN with fluorine of the etching chemistry to form TiF on sidewalls of the first capacitor electrodes that remains as part of a finished circuitry construction comprising the capacitors; and
   forming a capacitor dielectric over the TiF of the first capacitor electrodes and forming a second capacitor electrode over the capacitor dielectric.

20. The method of claim 19 comprising forming the TiF to be continuous along one sidewall of individual of the first capacitor electrodes in the finished circuitry construction.

21. The method of claim 19 comprising forming the TiF to be continuous along a top of individual of the first capacitor electrodes in the finished circuitry construction.

22. The method of claim 19 comprising forming the TiF to be continuous along one sidewall and along a top of individual of the first capacitor electrodes in the finished circuitry construction.

23. The method of claim 19 comprising forming the TiF to be discontinuous along one sidewall of individual of the first capacitor electrodes in the finished circuitry construction.

24. The method of claim 23 comprising forming the TiF to be continuous along another sidewall of the individual first capacitor electrodes in the finished circuitry construction.

25. The method of claim 23 comprising forming the TiF to be continuous along a top of the individual first capacitor electrodes in the finished circuitry construction.

26. The method of claim 25 comprising forming the TiF to be continuous along another sidewall of the individual first capacitor electrodes in the finished circuitry construction.

* * * * *